United States Patent
Funyu et al.

(10) Patent No.: US 6,353,561 B1
(45) Date of Patent: Mar. 5, 2002

(54) SEMICONDUCTOR INTEGRATED CIRCUIT AND METHOD FOR CONTROLLING THE SAME

(75) Inventors: Akihiro Funyu; Shinya Fujioka; Yasuharu Sato; Toshiya Uchida, all of Kawasaki (JP)

(73) Assignee: Fujitsu Limited, Tokyo (JP)

( * ) Notice: Subject to any disclaimer, the term of this patent is extended or adjusted under 35 U.S.C. 154(b) by 0 days.

(21) Appl. No.: 09/397,845

(22) Filed: Sep. 17, 1999

(30) Foreign Application Priority Data

Sep. 18, 1998 (JP) .............................. 10-265220

(51) Int. Cl.[7] .............................. G11C 7/00; G11C 8/00
(52) U.S. Cl. ........................................ 365/195; 365/233
(58) Field of Search ................................ 365/195, 233, 365/230.06, 189.05, 194

(56) References Cited

U.S. PATENT DOCUMENTS 5,748,560 A * 5/1998 Sawada ....................... 365/233
5,867,447 A * 2/1999 Koshikawa ................... 365/233
5,973,988 A * 10/1999 Nakahira et al. .......... 365/230.08
6,088,290 A * 7/2000 Ohtake et al. ............... 365/233
6,144,614 A * 11/2000 Kanda et al. ................ 365/233

* cited by examiner

Primary Examiner—Vu A. Le
Assistant Examiner—Anh Phung
(74) Attorney, Agent, or Firm—Arent Fox Kintner Plotkin & Kahn, PLLC

(57) ABSTRACT

A semiconductor memory device, such as a synchronous DRAM, receives external commands and an external clock signal via input buffers. The device generates internal clock signals having a slower frequency than the external clock signal and uses the internal clock signals to acquire the external command. This allows more than one external command to be acquired for each cycle of the external clock. The acquired external commands are provided to command decoders for decoding. A mask circuit is connected to the decoder circuits and inhibits the decoding circuits, except for a first one of the decoding circuits, from decoding the external commands for a predetermined time period, when the first decoder circuit is decoding the external commands.

10 Claims, 6 Drawing Sheets

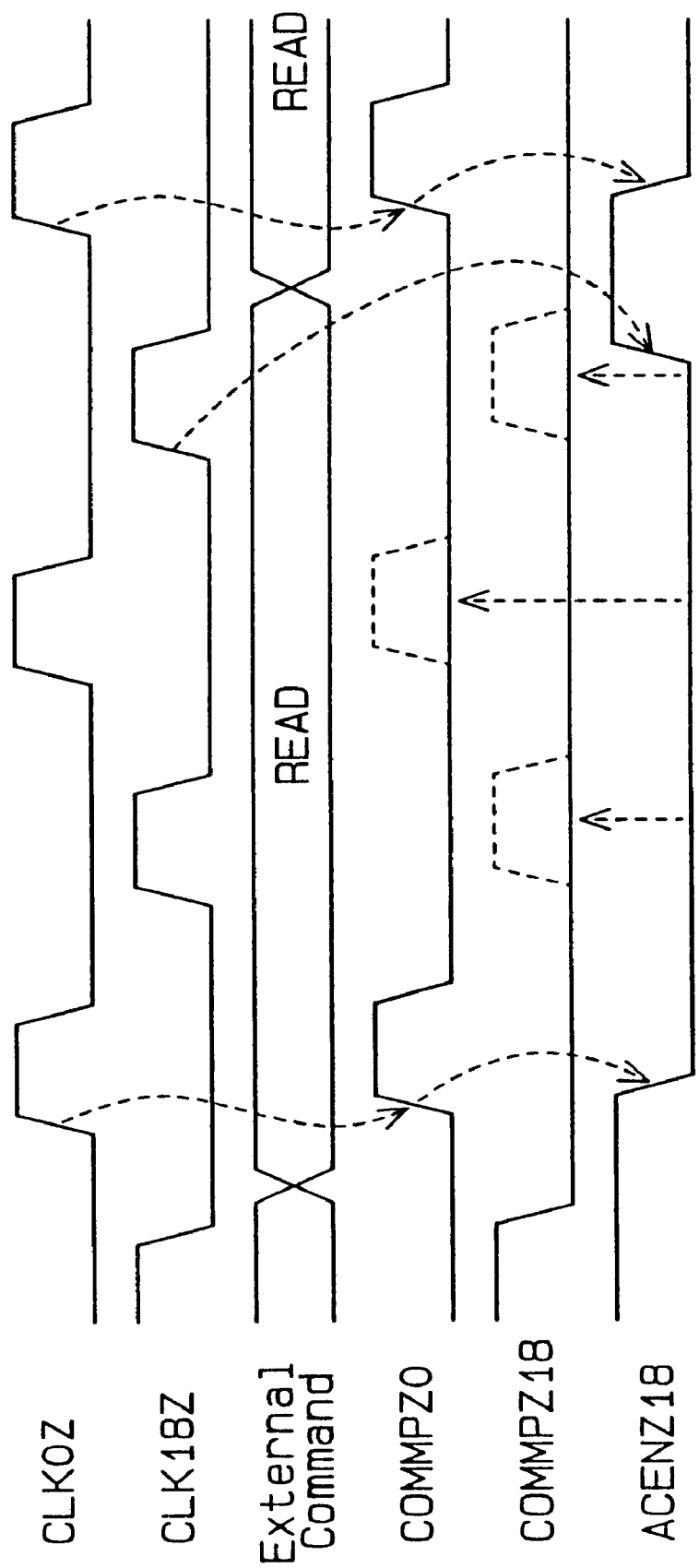

SEMICONDUCTOR INTEGRATED CIRCUIT AND METHOD FOR CONTROLLING THE SAME

BACKGROUND OF THE INVENTION

The present invention relates to semiconductor integrated circuits and a method for controlling semiconductor integrated circuits.

The frequency of a controller (CPU) that controls a dynamic random access memory (DRAM) is high and has been increasing. Thus, external commands are generated at high speed cycles by the controller and the DRAM is required to process such high speed external commands.

A synchronous DRAM has thus been proposed to receive the high speed external command synchronously with either a first internal clock signal or a second internal clock signal. More specifically, the DRAM divides the high frequency external clock signal from the controller in half. The phases of the divided signal are offset from each other by 180°. As a result, a first internal clock signal and a second internal clock signal having phases offset from each other by 180° are generated. The DRAM receives the external command in synchronism with an external clock signal when either the first internal clock signal or the second internal clock signal rises.

The DRAM includes a first signal processing circuit for processing an external command received synchronously with the first internal clock signal and a second signal processing circuit for processing an external command received synchronously with the second internal clock signal. The first and second signal processing circuits process external commands separately so that the high speed external commands can be followed.

However, such processing of the external commands has the shortcomings described below.

(1) Invalidation of the external commands from the DRAM controller may be delayed in accordance with the wire length and wire capacitance. In such case, the first and second signal processing circuits must receive an external command that is the same as the previous command and process the command once more. This hinders accurate decoding of the external command.

(2) When the input cycle of the external command is altered, the frequency of the first and second internal clock signal is varied. The varied first and second internal clock signals may result in the first and second signal processing circuits receiving an external command that is the same as the previous external command.

(3) Fluctuations in the temperature or power supply voltage may vary the frequency of the first and second internal clock signals. In such case, the first and second signal processing circuits may receive an external command that is the same as the previous external command.

Accordingly, it is an objective of the present invention to provide a semiconductor memory device that processes external commands accurately.

SUMMARY OF THE INVENTION

To achieve the above objective, the present invention provides a method for controlling a semiconductor integrated circuit device having a plurality of signal processing circuits, which process an input signal. The method includes the steps of receiving the input signal in one of the plurality of signal processing circuits and outputting an internal signal in response to a clock signal, and prohibiting another of the signal processing circuits from processing the input signal for a predetermined time in response to the internal signal.

In a further aspect of the present invention, a semiconductor integrated circuit device is provided. The device includes a plurality of signal processing circuits for processing an input signal. A prohibiting circuit is connected to the plurality of signal processing circuits. The prohibiting circuit prohibits another of the signal processing circuits from processing the input signals for a predetermined time in response to an internal signal which is output from one of the signal processing circuit based on the input signal.

In another aspect of the present invention, a semiconductor memory device is provided. The device includes a plurality of input buffers for receiving an external command in synchronism with a plurality of internal clock signals. A command decoder is connected to the plurality of input buffers to receive the external commands from the input buffers, decoding the external command, and generating internal commands. The command decoder has a plurality of decoding circuits. Each of the decoding circuits decodes the external commands in accordance with an associated one of the plurality of internal clock signals. A mask circuit is connected to the plurality of decoding circuits. The mask circuit prevents another of the decoding circuits from decoding the external command for a predetermined time when one of the decoding circuits decodes the external command.

BRIEF DESCRIPTION OF THE DRAWINGS

The invention, together with objects and advantages thereof, may best be understood by reference to the following description of the presently preferred embodiments together with the accompanying drawings in which:

FIG. 6 is a timing chart showing the operation of a data input circuit according to a second embodiment of the present invention.

DETAILED DESCRIPTION OF THE PREFERRED EMBODIMENTS

A synchronous DRAM data input circuit 10 according to a first embodiment of the present invention will now be described with reference to FIGS. 1 to 4.

The data input circuit 10 includes a first decoding circuit 12*a* and a second decoding circuit 12*b* (FIG. 2) which receive external commands in synchronism with a first internal clock signal CLK0Z and a second internal clock signal CLK18Z, respectively. When one of the decoding circuits 12*a*, 12*b* processes an external command, the other decoding circuit 12*a*, 12*b* is prohibited from processing an external command for a predetermined period.

Figure 1:
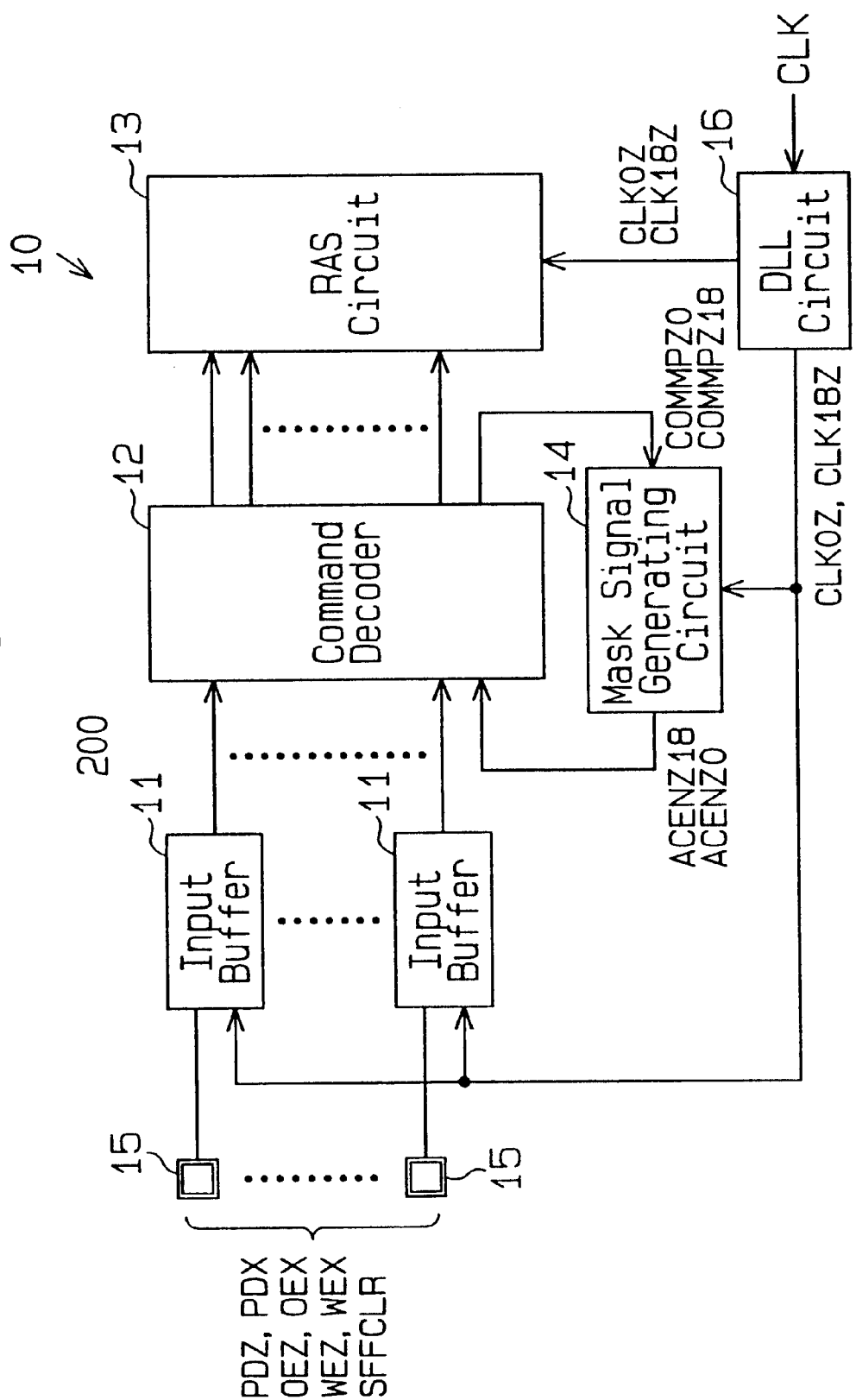
FIG. 1 is a block diagram showing a data input circuit of a synchronous DRAM according to a first embodiment of the present invention.

Referring to FIG. 1, the synchronous DRAM data input circuit 10 acquires external commands together with addresses. The data input circuit 10 includes a plurality of input buffers 11, a command decoder 12 for decoding the external commands acquired by each of the input buffers 11 and generating internal commands, an RAS circuit 13 for performing various processes such as reading and writing based on the internal command, a mask circuit (prohibiting circuit) 14 for controlling the command decoder 12, and a delay locked loop (DLL) circuit 16.

The DLL circuit 16 receives an external clock signal CLK from a DRAM controller and divides the clock signal CLK in half to generates the first and second internal clock signals CLK0Z, CLK18Z. The DLL circuit 16 provides the first and second internal clock signals CLK0Z, CLK18Z to the input buffers 11. The frequency of the first and second internal clock signals CLK0Z, CLK18Z is half of that of the external clock CLK. Thus, if the frequency of the external clock CLK is, for example, 400 MHz, the frequency of the first and second internal clock signals CLK0Z, CLK18Z is 200 MHz.

The first and second internal clock signals CLK0Z, CLK18Z have phases of 0° and 180°, respectively, offset from each other by half a cycle.

Each of the input buffers 11 receives external command signals PDZ, PDX, SFFCLR, OEZ, OEX, WEZ, WEX through input pads 15. These external command signals form the external command. The input buffers 11 receive the external command signals PDZ, PDX, SFFCLR, OEZ, OEX, WEZ, WEX in synchronism with the rising of the first and second internal clock signals CLK0Z, CLK18Z sent from the DLL circuit 16.

When receiving the external command signals PDZ, PDX, SFFCLR, OEZ, OEX, WEZ, WEX in response to the rising of the first and second internal clock signals CLK0Z, CLK18Z, the input buffers 11 are permitted to acquire the external commands and addresses provided in synchronism with the 400 MHz external clock signal CLK.

The external command signals include power-down signals PDZ, PDX, a chip enable signal SFFCLR, output enable signals OEZ, OEX, and write enable signals WEZ, WEX. The power-down signals PDZ, PDX are complementary signals. When the DRAM is actuated, the power-down signal PDZ is high, while the power-down signal PDX is low. The output signals OEZ, OEX and the write enable signals WEZ, WEX are also complementary signals. The chip enable signal SFFCLR is a pulse signal that is synchronized with the first and second internal clock signals CLK0Z, CLK18Z when the DRAM is actuated.

To facilitate description, the command signals acquired in response to the first internal clock signal CLK0Z are denoted as PDZ0, PDX0, SFFCLR0, OEZ0, OEX0, WEZ0, WEX0. The command signals acquired in response to the second internal clock signal CLK18Z are denoted as PDZ18, PDX18, SFFCLR18, OEZ18, OEX18, WEZ18, WEX18.

The command decoder 12 decodes the external commands from the input buffers 11 and generates internal commands.

Figure 2:
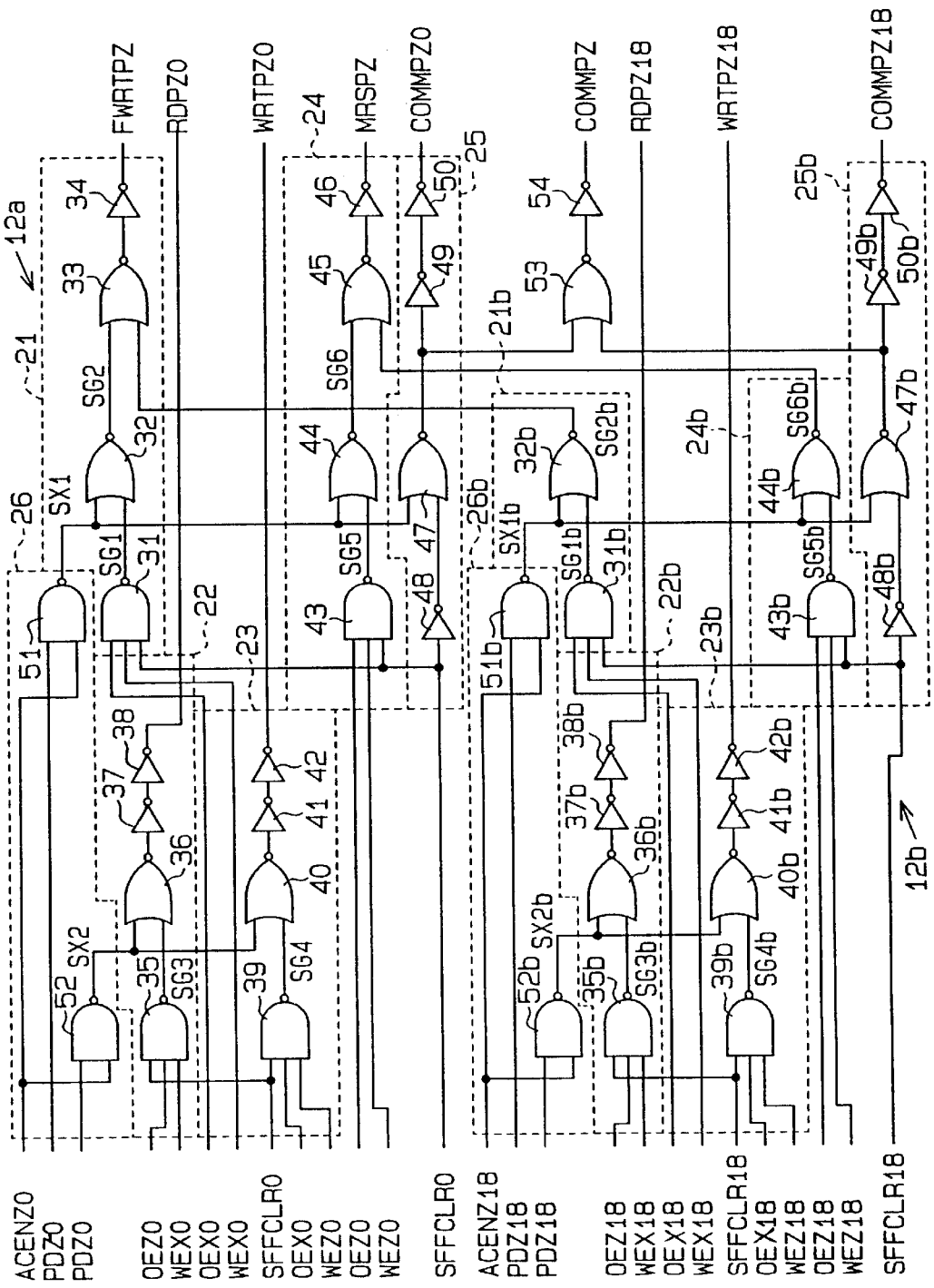
FIG. 2 is a circuit diagram showing a command decoder of the data input circuit of FIG. 1.

The command decoder 12 will now be described with reference to FIG. 2.

The command decoder 12 includes the first and second decoding circuits (signal processing circuit) 12a, 12b.

The first decoding circuit 12a receives and decodes the power-down signals PDZ0, PDX0, the chip enable signal SFFCLR0, the output enable signals OEZ0, OEX0, and the write enable signals WEZ0, WEX0 that are acquired in response to the rising of the first internal clock signal CLK0Z and generates the internal commands.

The second decoding circuit 12b receives and decodes the power-down signals PDZ18, PDX18, the chip enable signal SFFCLR18, the output enable signals OEZ18, OEX18, and the write enable signals WEZ18, WEX18 that are acquired in response to the rising of the second internal clock signal CLK18Z and generates the internal commands.

The first decoding circuit 12a includes a flash write (FWRT) command decoding portion 21, a read command decoding portion 22, a write command decoding portion 23, a mode register set decoding portion 24, a mask command generating portion 25, and an output control portion 26.

The FWRT command decoding portion 21 includes a NAND circuit 31, two NOR circuits 32, 33, and an inverter 34. The NAND circuit 31 has three input terminals which receive the output enable signal OEX0, the write enable signal WEX0, and the chip enable signal SFFCLR0. The NAND circuit 31 provides a low signal SG1 to the NOR circuit 32 when the output enable signal OEX0, the write enable signal WEX0, and the chip enable signal SFFCLR0 are all high.

The NOR circuit 32 has two input terminals which receive the signal SG1 from the NAND circuit 31 and a control signal SX1 from the output control portion 26. When the signals SX1, SG1 are both low, the NOR circuit 32 provides the NOR circuit 33 with a high signal SG2. The NOR circuit 33 outputs a high internal flash write command signal FWRTPZ via the inverter 34.

A flash write operation is executed when the internal flash write command signal FWRTPZ is high and prohibited when the flash write command signal FWRTPZ is low. If the control signal SX1 from the output control portion 26 is low when the output enable signal OEX0, the write enable signal WEX0, and the chip enable signal SFFCLR0 are all high, the internal flash write command signal FWRTPZ is caused to be high. In this state, the DRAM is set in a flash write mode.

The NOR circuit 33 receives a signal SG2b from a NOR circuit 32b of a flash write (FWRT) command decoding portion 21b employed in the second decoding circuit 12b. A high signal SG2b causes the internal flash write command signal FWRTPZ to be high and sets the DRAM in the flash write mode.

The read command decoding portion 22 includes a NAND circuit 35, a NOR circuit 36, and two inverters 37, 38. The NAND circuit 35 has three input terminals which receive the output enable signal OEZ0, the write enable signal WEX0, and the chip enable signal SFFCLR0. Further, the NAND circuit 35 provides a low signal SG3 to the NOR circuit 36 when the output enable signal OEZ0, the write enable signal WEX0, and the chip enable signal SFFCLR0 are all high.

The NOR circuit 36 has two input terminals which receive the signal SG3 from the NAND circuit 35 and a control signal SX2 from the output control portion 26. When the signals SX2 and SG3 are both low, the NOR circuit 36 outputs a high internal read command signal RDPZ0 via the inverters 37, 38.

A read operation is executed when the internal read command signal RDPZ0 is high and prohibited when the internal read command signal RDPZ0 is low. If the control signal SX2 from the output control portion 26 is low when the output enable signal OEZ0, the write enable signal WEX0, and the chip enable signal SFFCLR0 are all high, the internal read command signal RDPZ0 is caused to be high. In this state, the DRAM is set in a read mode.

The write command decoding portion 23 includes a NAND circuit 39, a NOR circuit 40, and two inverters 41, 42. The NAND circuit 39 has three input terminals which receive the output enable signal OEX0, the write enable signal WEZ0, and the chip enable signal SFFCLR0. Further, the NAND circuit 39 provides a low signal SG4 to the NOR circuit 40 when the output enable signal OEX0, the write enable signal WEZ0, and the chip enable signal SFFCLR0 are all high.

The NOR circuit 40 has two input terminals which receive the signal SG4 from the NAND circuit 39 and the control signal SX2 from the output control portion 26. When the signals SX2, SG4 are both low, the NOR circuit 40 outputs a high internal write command signal WRTPZ0 via the inverters 41, 42.

A write operation is executed when the internal write command signal WRTPZ0 is high and prohibited when the internal write command signal WRTPZ0 is low. If the control signal SX2 from the output control portion 26 is low when the output enable signal OEX0, the write enable signal WEZ0, and the chip enable signal SFFCLR0 are all high, the internal write command signal WRTPZ0 is caused to be high. In this state, the DRAM is set in a write mode.

The mode register set decoding portion 24 includes a NAND circuit 43, two NOR circuits 44, 45, and an inverter 46. The NAND circuit 43 has three input terminals which receive the output enable signal OEZ0, the write enable signal WEZ0, and the chip enable signal SFFCLR0. The NAND circuit 43 provides a low signal SG5 to the NOR circuit 44 when the output enable signal OEZ0, the write enable signal WEZ0, and the chip enable signal SFFCLR0 are all high.

The NOR circuit 44 has two input terminals which receive the signal SG5 from the NAND circuit 43 and the control signal SX1 from the output control portion 26. When the signals SX1 and SG5 are both low, the NOR circuit 44 provides the NOR circuit 45 with a high signal SG6. As a result, the NOR circuit 45 outputs a high internal mode command signal MRSPZ via the inverter 46.

A mode setting operation is executed when the internal mode command signal MRSPZ is high and prohibited when the internal mode command signal MRSPZ is low. If the control signal SX1 from the output control portion 26 is low when the output enable signal OEZ0, the write enable signal WEZ0, and the chip enable signal SFFCLR0 are all high, the internal mode command signal MRSPZ is caused to be high. In this state, the DRAM is set in a mode setting operation mode.

The NOR circuit 45 receives a signal SG6b from a NOR circuit 44b of a mode register set decoding portion 24b employed in the second decoding circuit 12b. A high signal SG6b causes the internal mode command signal MRSPZ to be high and sets the DRAM in the mode setting operation mode.

The mask command generating portion 25 includes a NOR circuit 47 and three inverters 48, 49, 50. The NOR circuit 47 has two input terminals which receive the control signal SX1 from the output control portion 26 and the chip enable signal SFFCLR0 via the inverter 48. Further, the NOR circuit 47 provides a high mask command signal COMMPZ0 via the inverters 49, 50 if the control signal SX1 is low when the chip enable signal SFFCLR0 is high.

A high mask command signal COMMPZ0 prohibits operation of the second decoding circuit 12b for a predetermined period. If the control signal SX1 from the output control portion 26 is low when the chip enable signal SFFCLR0 is high, the mask command signal COMMPZ0 is high.

The output control portion 26 includes two NAND circuits 51, 52 which receive the power-down signal PDZ0 and a first mask signal ACENZ0.

The first mask signal ACENZ0 is provided from the mask circuit 14 (FIG. 1). The first mask signal ACENZ0 remains low for a predetermined period after the second decoding circuit 12b provides the RAS circuit 13 with an internal command. If the power-down signal PDZ0 is high when the first mask signal ACENZ0 is low, the output control portion 26 outputs high control signals SX1, SX2.

In this state, high control signals SX1, SX2 prohibit decoding by the FWRT command decoding portion 21 of the first decoding circuit 12a, the read command decoding portion 22, the write command decoding portion 23, the mode register decoding portion 24, and the mask command generating portion 25 from decoding the power-down signals PDZ0, PDX0, the chip enable signal SFFCLR0, the output enable signals OEZ0, OEX0, and the write enable signals WEZ0, WEX0.

When the DRAM system, including the DRAM and DRAM controller, are actuated and the power-down signal PDZ0 is high, the control signals SX1, SX2 are low if the RAS circuit 13 is not provided with an internal command from the second decoding circuit 12b while the first mask signal ACENZ0 is high.

In this state, low control signals SX1, SX2 cause the FWRT command decoding portion 21 of the first decoding circuit 12a, the read command decoding portion 22, the write command decoding portion 23, the mode register decoding portion 24, and the mask command generating portion 25 to decode the power-down signals PDZ0, PDX0, the chip enable signal SFFCLR0, the output enable signals OEZ0, OEX0, and the write enable signals WEZ0, WEX0. The internal commands generated through the decoding process, that is, the internal flash write command signal FWRTPZ, the internal read command signal RDPZ0, the internal write command signal WRTPZ0, and the internal mode command signal MRSPZ, are provided to the RAS circuit 13.

The second decoding circuit 12b of the command decoder 12 will now be described.

The second decoding circuit 12b decodes the external commands (the power-down signals PDZ18, PDX18, the chip enable signal SFFCLR18, the output enable signals OEZ18, OEX18, and the write enable signals WEZ18, WEX18) that are acquired in synchronism with the second internal clock signal CLK18Z and generates the internal commands.

Like the first decoding circuit 12a, the second decoding circuit 12b includes a FWRT command decoding portion 21b, a read command decoding portion 22b, a write command decoding portion 23b, a mode register set decoding portion 24b, a mask command generating portion 25b, and an output control portion 26b.

The circuit portions 21b–26b correspond to the circuit portions 21–26 of the first decoding circuit 12a, respectively. Devices that are the same or similar to corresponding devices in the circuit portions 21–26 of the first decoding circuit 12a are denoted with the same reference numeral followed by the letter "b". These devices will not be described. The circuit portions 21b–26b differ from the circuit portions 21–26 in that the FWRT command decoding portion 21b and the mode register set decoding portion 24b include part of the FWRT command decoding portion 21 and the mode register set decoding portion 24b, respectively, and in that the output control portion 26b receives a second mask signal ACENZ18.

When the second mask signal ACENZ18 is low, the second decoding circuit 12b provides the internal flash write command signal FWRTPZ, an internal read command signal RDPZ18, an internal write command signal WRTPZ18, and the internal mode command signal MRSPZ to the RAS circuit 13 and a second mask command signal COMMPZ18 to the mask circuit 14 in accordance with the power-down signals PDZ18, PDX18, the chip enable signal SFFCLR18, the output enable signals OEZ18, OEX18, and the write enable signals WEZ18, WEX18.

When the output control portion 26b is provided with a high second mask signal ACENZ18, the circuit portions 21b–25b of the second decoding circuit 12b is prohibited from providing the internal flash write command signal FWRTPZ, the internal read command signal RDPZ18, the internal write command signal WRTPZ18, and from providing the second mask command signal COMMPZ18 to the mask circuit 14.

The output of the NOR circuits 47, 47b of the respective mask command generating portions 25, 25b are provided to the NOR circuit 53. The NOR circuit 53 provides a command signal COMMPZ to the RAS circuit 13 via an inverter 54.

The RAS circuit 13 receives the decoded internal commands FWRTPZ, RDPZ0, WRTPZ0, MRSPZ, COMMPZ, RDPZ18, WRTPZ18 from the first and second decoding circuits 12a, 12b. The RAS circuit 13 performs various operations, such as a write process and a read process, based on these internal commands.

The mask circuit 14, which generates the first and second mask signals ACENZ0, ACENZ18 in accordance with the first and second mask command signals COMMPZ0, COMMPZ18, will now be described with reference to FIG. 3.

Figure 3:
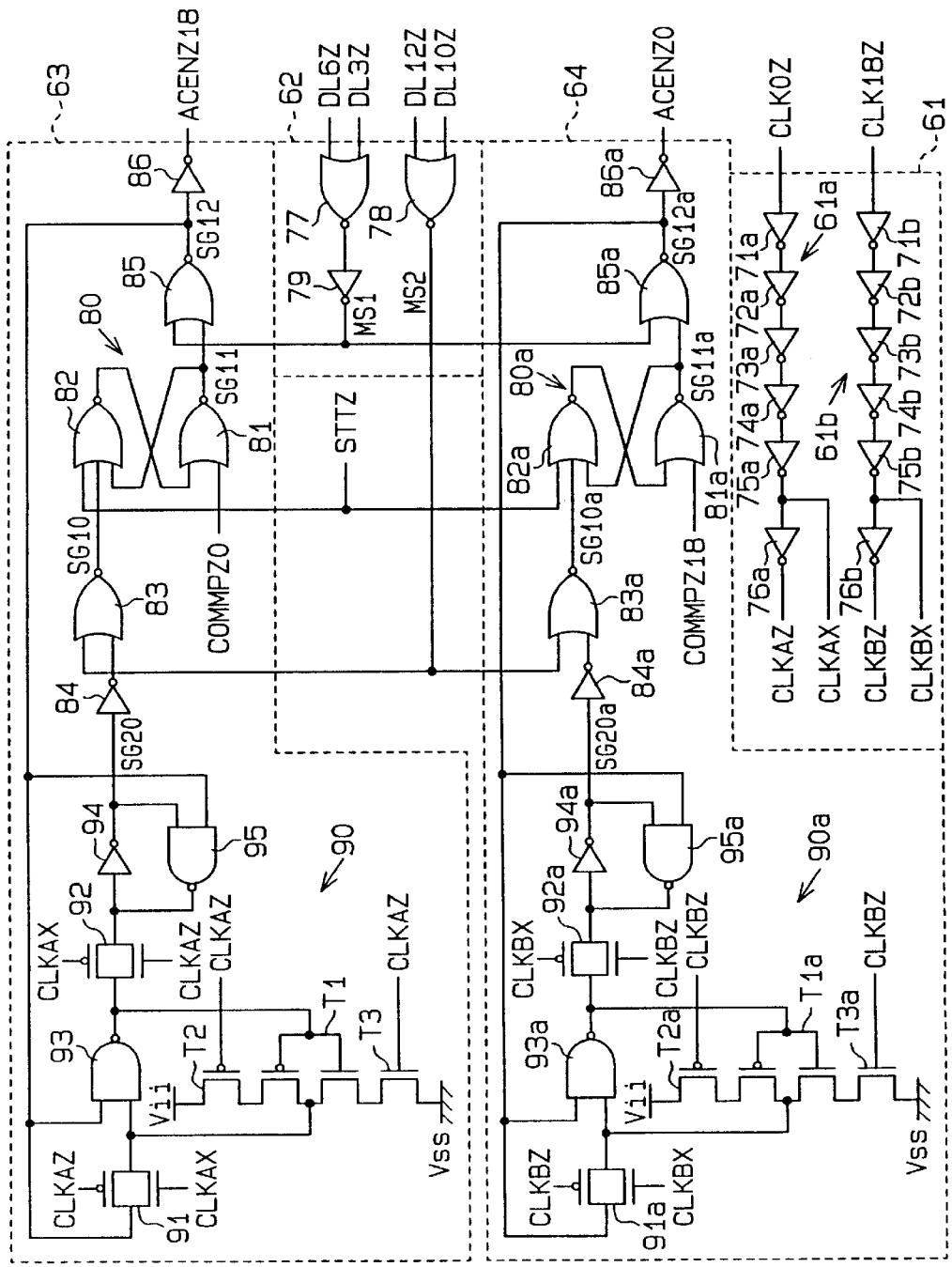
FIG. 3 is a circuit diagram showing a mask circuit of the data input circuit of FIG. 1.

As shown in FIG. 3, the mask circuit 14 includes a clock generating circuit 61, a mode set circuit 62, a first mask signal generating circuit 63, and a second mask signal generating circuit 64.

The clock generating circuit 61 includes a first generating portion 61a and a second generating portion 61b. The first generating portion 61a receives the first internal clock signal CLK0Z and outputs complementary first gate clock signals CLKAZ, CLKAX. Further, the first clock generating portion 61a includes six inverters 71a–76a, which are connected to one another in series. The inverter 71a receives the first internal clock signal CLK0Z and the inverter 76a outputs a delayed first internal clock signal CLK0Z as the first gate clock signal CLKAZ. The inverter 75a outputs the first gate clock signal CLKAX.

The delay time of the first gate clock signals CLKAZ, CLKAX relative to the first internal clock signal CLK0Z corresponds to the time from when the command decoder 12 acquires the external command to when the decoded external command is output as an internal command.

The second generating portion 61b receives the second internal clock signal CLK18Z and outputs complementary second gate clock signals CLKBZ, CLKBX. The second clock generating portion 61b includes six inverters 71b–76b, which are connected to one another in series. The inverter 71b receives the second internal clock signal CLK18Z and the inverter 76b outputs the delayed second internal clock signal CLK18Z as the second gate clock signal CLKBZ. The inverter 75b outputs the second gate clock signal CLKBX.

The delay time of the second gate clock signals CLKBZ, CLKBX relative to the second internal clock signal CLK18Z corresponds to the time from when the command decoder 12 acquires the external command to when the decoded external command is output as an internal command.

The mode set circuit 62 includes two NOR circuits 77, 78 and an inverter 79. The NOR circuit 77 includes two input terminals which receive a first mode signal DL3Z and a second mode signal DL6Z. The NOR circuit 78 includes two input terminals which receive a third mode signal DL10Z and a fourth mode signal DL12Z.

The first to fourth mode signals DL3Z, DL6Z, DL10Z, DL12Z indicate the frequency of the external clock signal CLK used by the DRAM and are generated by the DRAM based on the frequency of the first and second internal clock signals CLK0Z, CLK18Z generated by the DLL circuit 16.

The first mode signal DL3Z is high when the frequency of the external clock signal CLK is 100 MHz. The second mode signal DL6Z is high when the frequency of the external clock signal CLK is 200 MHz. The third mode signal DL10Z is high when the frequency of the external clock signal CLK is 333 MHz. The fourth mode signal DL12Z is high when the frequency of the external clock signal CLK is 400 MHz. The first to fourth mode signals DL3Z, DL6Z, DL10Z, DL12Z are low when the external clock signal CLK has a frequency that differs from the corresponding value.

If either the first mode signal DL3Z or the second mode signal DL6Z is high, the NOR circuit 77 outputs a high first speed mode signal MS1 via the inverter 79. That is, the mode set circuit 62 outputs a high first speed mode signal MS1 if the DRAM is used when the frequency of the external clock signal CLK is low, such as 100 MHz or 200 MHz.

If either the third mode signal DL10Z or the second mode signal DL12Z is high, the NOR circuit 78 outputs a low second speed mode signal MS2. That is, the mode set circuit 62 outputs a low second speed mode signal MS2 if the DRAM is used when the frequency of the external clock signal CLK is high at 300 MHz or 400 MHz.

The first mask signal generating circuit 63 includes a flip-flop (FF) circuit 80, NOR circuits 83, 85, inverters 84, 86, and a return circuit 90. The FF circuit 80 includes a set NOR circuit 81 and a reset circuit 82. The set NOR circuit 81 receives the first mask command signal COMMPZ0 from the mask command generating portion 25 of the first decoding circuit 12a. The reset NOR circuit 82 has three input terminals which receive a starter signal STTZ, a reset signal SG10 from the NOR circuit 83, and a signal SG11 from the NOR circuit 81. The starter signal STTZ remains high for a certain period when the DRAM is actuated.

The NOR circuit 83 has two input terminals which receive the second speed mode signal MS2 from the mode set circuit 62 and a return signal SG20 via the inverter 84. If the second speed mode signal MS2 is low when the return signal SG20 is high, the NOR circuit 83 provides a high reset signal SG10 to the NOR circuit 82.

The NOR circuit 81 of the FF circuit 80 provides a high signal SG11 to the NOR circuit 85 when the DRAM is actuated. When the NOR circuit 81 receives a high first mask command signal COMMPZ0, the FF circuit 80 (NOR circuit 81) inverts the signal and provides a low signal SG11 to the NOR circuit 85.

The NOR circuit 85 has two input terminals which receive the signal SG11 from the FF circuit 80 and the first speed mode signal MS1 from the mode set circuit 62. If the first speed mode signal MS1 is low when the signal SG11 is high, the NOR circuit 85 provides a low signal SG12 to the inverter 86. Further, if the first speed mode signal MS1 and the signal SG11 are both low, the NOR circuit 85 provides a high signal SG12 to the inverter 86.

The inverter 86 receives the signal SG12 from the NOR circuit 85 and provides the second decoding circuit 12b of the output control portion 26b with the second mask signal ACENZ18, which is equal to the signal SG12 inverted.

More specifically, if the first speed mode signal MS1 is low when the signal SG11 is high, the second mask signal ACENZ18 is high. In this state, if the first mask command signal COMMPZ0 rises and the signal SG11 falls, the second mask signal ACENZ18 falls. From this state, if the FF circuit 80 outputs a high signal SG11 in response to a high reset signal SG10, the second mask signal ACENZ18 rises.

In other words, when the second mask signal ACENZ18 falls, the control signals SX1B, SX2B from the output control portion 26b of the second decoding circuit 12b rise. This prohibits the second decoding circuit 12b from decoding the external commands.

The return circuit 90 includes two transfer gate circuits 91, 92, transistors T1–T3, an inverter 94, and NAND circuits 93, 95. The return circuit 90 measures the elapsed time from when the second mask signal ACENZ18 falls. After a predetermined elapsed time, the return circuit 90 causes the mask signal ACENZ18 to rise.

The transfer gate circuits 91, 92 are each formed by a PMOS transistor and an NMOS transistor. In the transfer gate circuit 91, the PMOS transistor gate is provided with the first gate clock signal CLKAZ and the NMOS transistor gate is provided with the first gate clock signal CLKAX. In the transfer gate circuit 92, the PMOS transistor gate is provided with the first gate clock signal CLKAX and the NMOS transistor gate is provided with the first gate clock signal CLKAZ. Therefore, the transfer gate circuit 91, 92 is activated and deactivated alternately in accordance with the first gate clock signals CLKAZ, CLKAX. More specifically, the transfer gate circuit 91 is activated when the first gate clock signal CLKAZ (first internal clock signal CLK0Z) rises and deactivated when the first gate clock signal CLKAZ falls.

The transfer gate circuit 91 has an input terminal connected to the output terminal of the NOR circuit 85 and an output terminal connected to the NAND circuit 93. Further, the transfer gate circuit 91 provides the signal SG12 from the NOR circuit 85 to the NAND circuit 93.

The NAND circuit 93 receives the signal SG12 via the transfer gate circuit 91 and also directly from the NOR circuit 85. Further, the NAND circuit 93 has an output terminal connected to the input terminal of the CMOS transistor T1 and the output terminal of the gate circuit 91.

The PMOS transistor T2 is connected between the CMOS transistor T1 and a high potential power supply Vii and activated and deactivated by the first gate clock signal CLKAX. The NMOS transistor T3 is connected between the CMOS transistor T1 and a ground potential Vss and activated and deactivated by the first gate clock signal CLKAZ. The CMOS transistor T1 is activated when the transfer gate circuit 91 is deactivated, and deactivated when the transfer gate circuit 91 is activated.

The NAND circuit 93 and the CMOS transistor T1 form a latch circuit. The NAND circuit 93 receives a low signal SG12 from the NOR circuit 85 and provides a high signal to the transfer gate circuit 92 when receiving a low signal SG12 from the NOR circuit 85. If the CMOS transistor T1 is activated when the transfer gate circuit 91 is deactivated, the CMOS transistor T1 receives a high signal from the NAND circuit 93 and provides a low signal to the NAND circuit 93. This causes the output signal of the NAND circuit 93 to go high.

When the signal SG12 from the NOR circuit 85 rises, the high signal SG12 is provided directly to the NAND circuit 93. In this state, the output signal of the NAND circuit 93 remains high since the first gate clock signal CLKAZ (first internal clock signal CLK0Z) is still high and the transfer gate circuit 91 is deactivated.

When the first gate clock signal CLKAZ (first internal clock signal CLK0Z) falls and activates the transfer gate circuit 91 (i.e., deactivates the transfer gate circuit 92), the output signal of the NAND circuit 93 falls. Since the transfer gate circuit 92 is deactivated, the low signal from the NAND circuit 93 is not immediately provided to the inverter 94 via the transfer gate circuit 92. The NAND circuit 93 provides the low signal to the inverter circuit 94 via the transfer gate circuit 92 when the first gate clock signals CLKAZ, CLKAX are inverted (i.e., when the first internal clock signal CLK0Z rises) and the transfer gate circuit 92 is activated.

The NAND circuit 95 has two input terminals which receive the signal from the inverter circuit 94 and the signal SG12 from the NOR circuit 85. Further, the NAND circuit 95 has an output terminal connected to the input terminal of the inverter 94.

The inverter 94 and the NAND circuit 95 form a latch circuit. The transfer gate circuit 92 is deactivated when the signal SG12 and the signal from the inverter 94 are both low. The output signal of the inverter 94 remains low when the signal SG12 rises since the transfer gate circuit 92 is deactivated.

If the NAND circuit 93 provides the inverter 94 with a low signal when the transfer gate circuit 92 is activated, the inverter 94 provides a high signal to the NAND circuit 95. The NAND circuit 95 provides a low signal to the inverter 94 in response to receiving a low signal from the inverter 94. This causes the output signal of the inverter 94 to go high. The output signal of the inverter 94 is provided to the NOR circuit 83 via the inverter 84 as the return signal SG20. If the return signal SG20 falls when the second speed mode signal MS2 is low, the NOR circuit 83 provides a high reset signal SG10 to the NOR circuit 82.

Therefore, if the return signal SG12 from the NOR circuit 85 falls, the return signal SG20 falls after the first internal clock signal CLK0Z that acquires the external command rises. In other words, the second mask signal ACENZ18 rises one cycle of the first internal clock signal CLK0Z subsequent to the acquisition of the external command.

Accordingly, the second decoding circuit 12b is prohibited from decoding the external commands acquired in synchronism with the second internal clock signal CLK18Z until the second mask signal ACENZ18 rises.

The second mask signal generating circuit 64 has substantially the same circuit structure as the first mask signal generating circuit 63. However, the second mask signal generating circuit 64 differs from the first mask signal generating circuit 63 in that the generating circuit 64 receives the second mask command signal COMMPZ18 and the second gate clock signals CLKBZ, CLKBX and in that the first mask signal ACENZ0 is provided to the output control portion 26 of the first decoding circuit 12a. Devices that are the same or similar to corresponding devices in the first mask signal generating circuit 63 are denoted with the same reference numeral followed by the letter "a". The second mask signal generating circuit 64 will not be described since it operates in substantially the same manner as the first mask signal generating circuit 63.

Like the first mask signal generating circuit 63, in the second mask signal generating circuit 64, if a return signal SG12a from a NOR circuit 85a falls, a return signal SG20a falls when the second internal clock signal CLK18Z that acquires the external command rises. In other words, the first mask signal ACENZ0 rises one cycle of the second internal clock signal CLK18Z subsequent to the acquisition of the external command.

Accordingly, the first decoding circuit 12a is prevented from decoding the external commands acquired in synchronism with the first internal clock signal CLK0Z until the first mask signal ACENZ0 rises.

Figure 4:
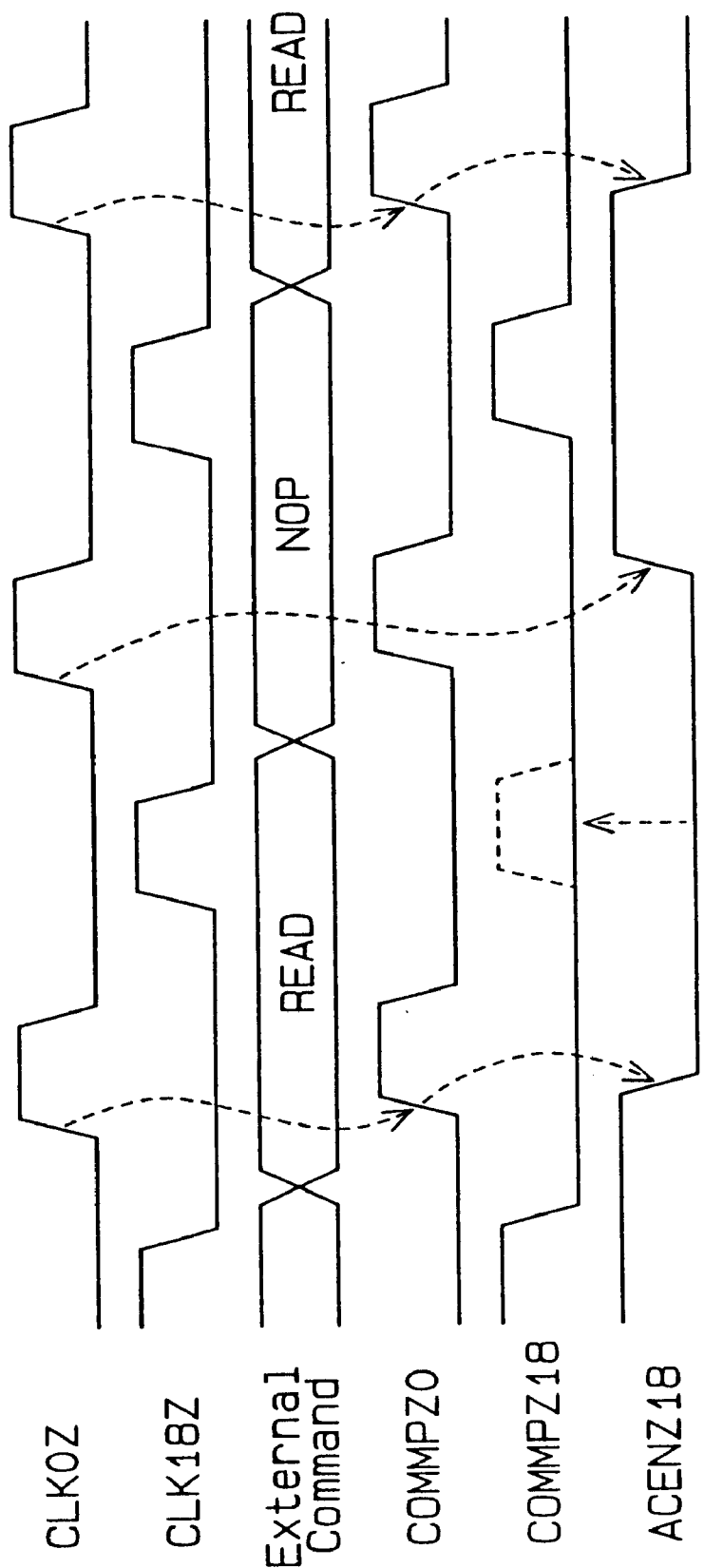
FIG. 4 is a timing chart showing the operation of the data input circuit of FIG. 1.

With reference to FIG. 4, the operation of the data input circuit 10 will now be described.

When an external command is acquired in synchronism with the rising of the first internal clock signal CLK0Z, a high first mask command signal COMMPZ0 is provided to the first mask signal generating circuit 63 of the mask circuit 14.

The first mask signal generating circuit 63 provides a low second mask signal ACENZ18 to the output control portion 26b of the second decoding circuit 12b in response to the high first mask command signal COMMPZ0. The output control portion 26b then provides high control signals SX1b, SX2b to the FWRT command decoding portion 21b, the mode register set decoding portion 24b, and the mask command generating portion 25b in response to the low second mask signal ACENZ18. This prevents decoding of external command signals by the circuit portions 21b–25b of the second decoding circuit 12b.

Afterward, the first mask signal generating circuit 63 outputs a high second mask signal ACENZ18 after the first internal clock signal CLK0Z that acquires the external command rises. In other words, the second internal clock signal CLK18Z rises substantially simultaneously with the falling of the first internal clock signal CLK0Z that acquires the external command. The circuit portions 21b–25b of the second decoding circuit 12b are prevented from decoding external command signals while the second internal clock signal CLK18Z is high.

As shown in FIG. 4, the circuit portions 21b–25b do not decode external command signals when the external command signals are provided to the command decoder 12 in a relatively slow cycle even if the input buffer 11 provides external command signals that are the same as the previous cycle in response to the rising of the second internal clock signal CLK18Z. This prevents the command decoder 12 from decoding the same external command signal continuously and repeatedly providing the resulting internal commands to the RAS circuit 13. Thus, the external command is decoded accurately.

Furthermore, the input of an external command that is the same as the prior external command is prevented even if the wire length or wire capacitance of the DRAM causes a delay in the invalidation of the external command from the DRAM controller.

The return circuits 90, 90a determine the period during which the first and second mask signals ACENZ0, ACENZ18 remain low in accordance with the first and second internal clock signals CLK0Z, CLK18Z (more precisely, the first and second gate clock signals CLKAZ, CLKAX, CLKBZ, CLKBX generated in accordance with the first and second internal clock signals CLK0Z, CLK18Z).

Therefore, if the first and second internal clock signals are altered when the external clock signal CLK is altered or if the frequency of the first and second internal clock signals CLK0Z, CLK18Z is varied when the temperature or power supply voltage fluctuates, the prohibition time is repeatedly determined based on such changes. Accordingly, the DRAM automatically adjusts the prohibition time when the frequency of the external clock signal CLK is varied.

The mode set circuit 62 provides a high first speed mode signal MS1 to the first and second mask signal generating circuits 63, 64 when the frequency of the external clock signal CLK is low at 100 MHz or 200 MHz. Further, the mode set circuit 62 provides a high second speed mode signal MS2 to the first and second mask signal generating circuits 63, 64 when the frequency of the external clock signal CLK is high at 333 MHz or 400 MHz.

If the frequency of the external clock signal CLK is relatively low, the first and second speed mode signals MS1, MS2 are both high. This keeps the first and second mask signals ACENZ0, ACENZ18 high even if the first and second mask signal generating circuits 63, 64 provide high first and second mask command signals COMMPZ0, COMMPZ18.

If the frequency of the external clock signal CLK is relatively high, the first and second speed mode signals MS1, MS2 are both low. This causes the first and second mask signal generating circuits 63, 64 to generate low first and second mask signals ACENZ0, ACENZ18 in response to high first and second mask command signals COMMPZ0, COMMPZ18. Accordingly, the operation of the mask circuit 14 is stopped when the cycle of the external command signals is capable of following the first and second internal clock signals CLK0Z, CLK18Z.

Second Embodiment

A data input circuit according to a second embodiment of the present invention will now be described with reference to FIG. 5. The second embodiment differs from the first embodiment in that it employs a different mask circuit 114. Otherwise, like or same reference numerals are given to those components that are the same as the corresponding components of the first embodiment and will not be described.

Figure 5:
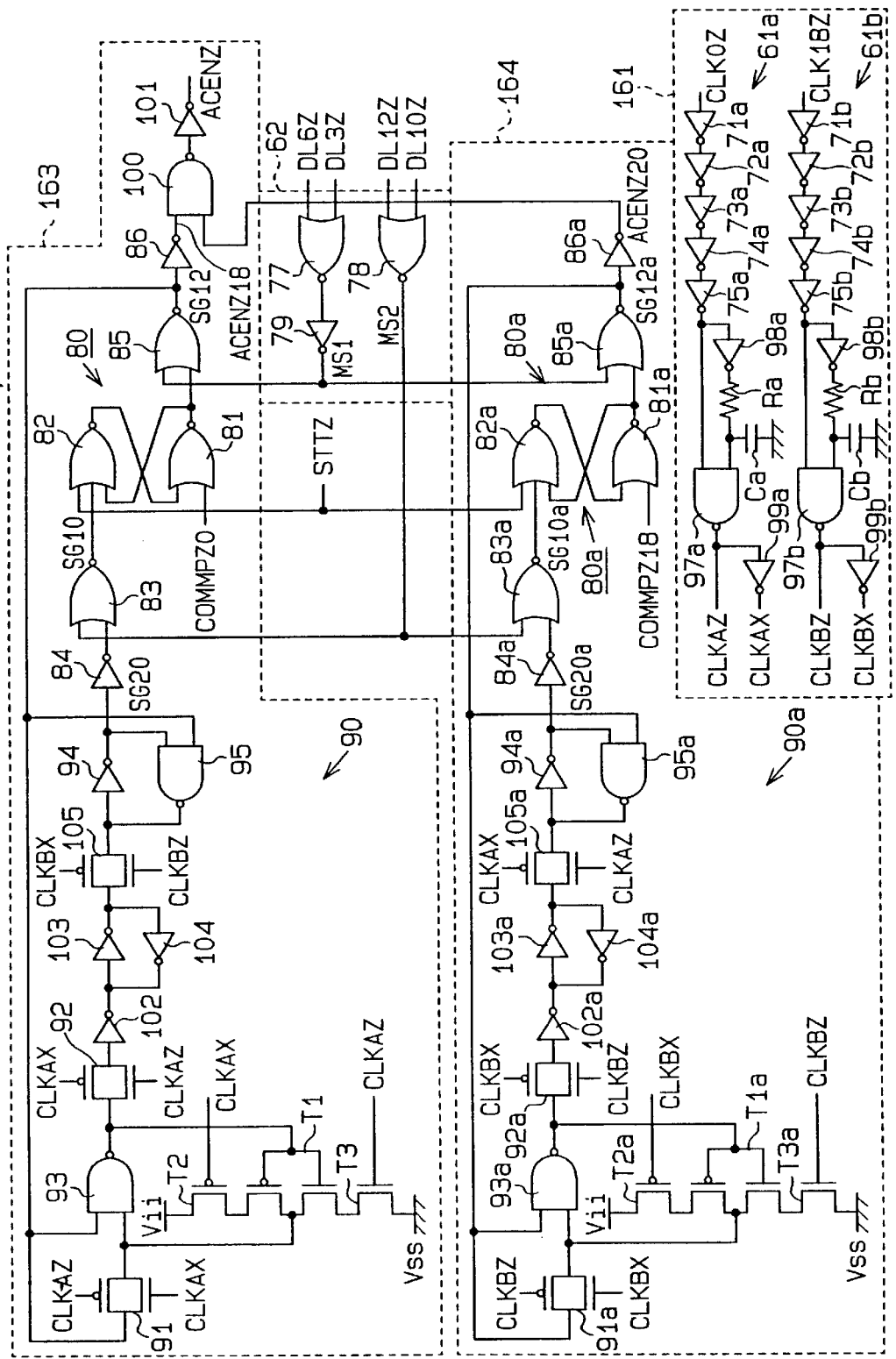
FIG. 5 is a circuit diagram showing a mask circuit according to a second embodiment of the present invention.

As shown in FIG. 5, the mask circuit 114 includes a clock generating circuit 161 having capacitors Ca, Cb, resistors Ra, Rb, NAND circuits 97a, 97b, and inverters 98a, 98b, 99a, 99b in lieu of the inverters 76a, 76b employed in the first embodiment.

In the first generating portion 61a, the period during which the first gate clock signal CLKAZ remains low (or the period during which the first gate clock signal CLKAZ remains high) is determined by a delay circuit that includes the capacitor Ca and the resistor Ra. In the second generating portion 61b, the period during which the second gate clock signal CLKBZ remains low (or the period during which the second gate clock signal CLKBZ remains high) is determined by a delay circuit that includes the capacitor Cb and the resistor Rb.

A first mask signal generating circuit 163 includes a NAND circuit 100 which receives the first and second mask signals ACENZ0, ACENZ18 from the first and second mask signal generating circuits 63, 64. The NAND circuit 100 provides the mask signal ACENZ via the inverter 101 to the output control portions 26a, 26b of the first and second decoding circuits 12a, 12b in the command decoder 12. Thus, if either the first mask signal ACENZ0 or the second mask signal ACENZ18 is low, the first and second decoding circuits 12a, 12b are both prevented from decoding external commands into internal commands.

A return circuit 90 includes an inverter 102, a latch circuit formed by inverters 103, 104, and a third transfer gate circuit 105 which are arranged between the transfer gate circuit 92 and the inverter 94. In the same manner, a return circuit 90a includes an inverter 102a, a latch circuit formed by inverters 103a, 104a, and a third transfer gate circuit 105a which are arranged between the transfer gate circuit 92a and the inverter 94a.

The inverter 102 of the first mask signal generating circuit 163 receives a signal from the NAND circuit 93 via the transfer gate circuit 92. The signal of the inverter 102 is provided to the latch circuit formed by the inverters 103, 104. The latch circuit provides a signal to the inverter 94 via the third transfer gate circuit 105.

The second gate clock signal CLKBX is provided to the PMOS transistor gate of the third transfer gate circuit 105, and the second gate clock signal CLKBZ is provided to the NMOS transistor gate of the third transfer gate circuit 105. Activation of the third transfer gate circuit 105 also activates the transfer gate circuit 91. On the other hand, deactivation of the third transfer gate circuit 105 deactivates the transfer gate circuit 91.

The inverter 102a of the first mask signal generating circuit 164 receives a signal from the NAND circuit 93a via the transfer gate circuit 92a. The signal of the inverter 102a is provided to the latch circuit formed by the inverters 103a, 104a. The latch circuit provides a signal to the inverter 94a via the third transfer gate circuit 105a.

The first gate clock signal CLKAX is provided to the PMOS transistor gate of the third transfer gate circuit 105a, and the first gate clock signal CLKAZ is provided to the NMOS transistor gate of the first transfer gate circuit 105a. Activation of the third transfer gate circuit 105a also activates the transfer gate circuit 91a. On the other hand, deactivation of the third transfer gate circuit 105a deactivates the transfer gate circuit 91a.

If the signal SG12 is low, the signal from the NAND circuit 93 and the inverter 103 is high, and the signal from the inverter 94 is low, rising of the signal SG12 keeps the signal from the NAND circuit 93 high since the transfer gate circuit 91 is deactivated. Accordingly, the signal output by the inverter 103 remains high even when the transfer gate circuit 92 is activated. Furthermore, the signal output by the inverter 94 remains low since the third transfer gate circuit 105 is deactivated.

When the transfer gate circuit 91 is activated, the signal from the NAND circuit 93 falls. Since the transfer gate circuit 92 is deactivated in this state, the signal from the inverter 103 remains high. Accordingly, the signal output by the inverter 94 remains low even when the third transfer gate circuit 105 is activated.

When the transfer gate circuit 91 is deactivated (i.e., when the transfer gate circuit 92 is activated), the signal from the inverter 103 falls. Since the third transfer gate circuit 105 is deactivated in this state, the signal from the inverter 94 remains low.

If the transfer gate circuit 91 and the third transfer gate circuit 105 are activated (i.e., if the transfer gate circuit 92 is activated), the signal output by the inverter 94 remains high in accordance with the low signal from the inverter 103. The signal from the inverter 94 is provided as the return signal SG20 to the NOR circuit 83 via the inverter 84. Thus, if the return signal SG20 falls when the second speed mode signal MS2 is low, the NOR circuit 83 provides a high reset signal SG10 to the NOR circuit 82.

Therefore, when the signal SG12 from the NOR circuit 85 falls, the return signal SG20 falls after the pulse following the pulse of the first internal clock signal CLK0Z that acquires the external command rises. Thus, the second mask signal ACENZ18 rises after two cycles of the first internal clock signal CLK0Z, after the external command is acquired.

Accordingly, the first and second internal clock signals CLK0Z, CLK18Z do not decode the external command acquired by the first and second internal clock signals CLK0Z, CLK18Z as long as the second mask signal ACENZ18 remains high.

When the signal SG12a from the second mask signal generating circuit 164 rises, the return circuit 90a operates in the same manner as the return circuit 90 of the first mask signal generating circuit 163. Thus, the operation of the return circuit 90a will not be described.

In the second embodiment, the first and second mask signals ACENZ0, ACENZ18 of the first and second mask signal generating circuits 163, 164 are integrated into the single mask signal ACENZ. The mask signal ACENZ is provided to the first and second decoding circuits 12a, 12b. If either the first decoding circuit 12a or the second decoding circuit 12b generates a high first or second command signal CMMPZ0, CMMPZ18, the first mask signal generating circuit 163 outputs a high mask signal ACENZ. This prevents the first and second decoding circuits 12a, 12b from decoding external commands.

With reference to FIG. 6, the return circuits 90, 90a invalidate the mask signal ACENZ (the signal ACENZ being high) a cycle and one-half of the first and second internal clock signals CLK0Z, CLK18Z after the first and second mask command signals CMMPZ0, CMMPZ18 are provided to the associated first and second mask signal generating circuits 163, 164.

Therefore, if an external command is acquired by the first internal clock signal CLK0Z, when the first mask command signal CMMPZ0 is provided, decoding of external commands is prevented until the first subsequent pulse of the first internal clock signal CLK0Z and the second subsequent pulse of the second internal clock signal CLK18Z occur.

Accordingly, for example, when the DRAM controller requires time for the output of the next command, the DRAM controller need not provide a no-operation command (NOP command) before the output of the next command.

It should be apparent to those skilled in the art that the present invention may be embodied in many other specific forms without departing from the spirit or scope of the invention. Particularly, it should be understood that the present invention may be embodied in the following forms.

In each of the above embodiments, the mask signals ACENZ0, ACENZ18, ACENZ may be used to control the input buffers 11 instead of the command decoder 12. This stops the operation of the command decoder 12 and the input buffers 11 for a predetermined period and reduces power consumption.

The application of the present invention is not limited to semiconductor memory devices, such as a DRAM. For example, the present invention may be applied to a semiconductor that processes commands and data acquired by a plurality of internal clock signals.

In the above embodiments, the commands and addresses may be acquired separately in accordance with the first and second internal command signals CLK0Z, CLK18Z.

The present examples and embodiments are to be considered as illustrative and not restrictive, and the invention is not to be limited to the details given herein, but may be modified within the scope and equivalence of the appended claims.

What is claimed is:

1. A semiconductor memory device comprising:

a plurality of input buffers for receiving an external command in synchronism with a plurality of internal clock signals;

a command decoder connected to the plurality of input buffers to receive the external command from the input buffers, the command decoder decoding the external command, and generating internal commands, wherein the command decoder has a plurality of decoding circuits, each of the decoding circuits decoding the external command in accordance with an associated one of the plurality of internal clock signals; and a mask circuit connected to the plurality of decoding circuits, wherein the mask circuit prevents another of the decoding circuits from decoding the external command for a predetermined time when one of the decoding circuits decodes the external command.

2. The device according to claim 1, wherein the mask circuit sets the predetermined time by using a clock signal.

3. The device according to claim 1, wherein the input signal is provided commonly to the decoding circuits.

4. The device according to claim 1, wherein each of the decoding circuit includes:

a mask command generating portion for generating a command signal that indicates termination of the decoding of the external command and providing the command signal to the mask circuit; and an output control portion provided for each of the decoding circuits to control the decoding.

5. The device according to claim 4, wherein the mask circuit includes:

a mask signal generating circuit for generating a mask signal in response to the command signals from the mask command generating portions and providing the mask signal to the output control portions of the decoding circuits; and a return circuit for invalidating the mask signal after a second predetermined time elapses.

6. The device according to claim 5, wherein the return circuit sets the second predetermined time to a period corresponding to one cycle of the corresponding internal clock signal or longer from when the external command is acquired.

7. The device according to claim 5, wherein the mask circuit provides the mask signal to all of the output control portions of the decoding circuits.

8. The device according to claim 5, wherein the mask signal generating circuit includes a mode setting signal circuit for preventing the generation of the mask signal in accordance with frequency of an external clock signal from which the internal clock signals are derived.

9. The device according to claim 1, wherein the input buffers acquiring an external command in synchronism with either of a first or a second internal clock signal, and wherein the plurality of decoding circuits include the first decoding circuit for decoding the external command in accordance with the first internal clock signal, and a second decoding circuit for decoding the external command in accordance with the second internal clock signal.

10. The device according to claim 9, wherein the mask circuit sets the predetermined time by using the first internal clock signal when the first decoding circuit performs the decoding operation, and sets the predetermined time using at least the second internal clock signal when the second decoding circuit performs the decoding operation.

* * * * *

UNITED STATES PATENT AND TRADEMARK OFFICE
CERTIFICATE OF CORRECTION

PATENT NO. : 6,353,561 B1
DATED : March 5, 2002
INVENTOR(S) : Akihiro Funyu et al.

It is certified that error appears in the above-identified patent and that said Letters Patent is hereby corrected as shown below:

<u>Title page,</u>
Item [73], Assignee, please change the address of the assignee from "Tokyo" to
-- Kawasaki --.

Signed and Sealed this

Third Day of June, 2003

JAMES E. ROGAN
*Director of the United States Patent and Trademark Office*